United States Patent
Wang (10) Patent No.: US 9,722,205 B2
(45) Date of Patent: Aug. 1, 2017

(54) ACTIVE-MATRIX ORGANIC LIGHT-EMITTING DIODE (AMOLED) DISPLAY PANEL, MANUFACTURING METHOD THEREOF AND DISPLAY DEVICE

(71) Applicant: BOE TECHNOLOGY GROUP CO., LTD., Beijing (CN)

(72) Inventor: Chun Jan Wang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 14/761,392

(22) PCT Filed: Nov. 28, 2014

(86) PCT No.: PCT/CN2014/092482
§ 371 (c)(1),
(2) Date: Jul. 16, 2015

(87) PCT Pub. No.: WO2016/000393
PCT Pub. Date: Jan. 7, 2016

(65) Prior Publication Data
US 2016/0254483 A1    Sep. 1, 2016

(30) Foreign Application Priority Data
Jul. 2, 2014 (CN) .......................... 2014 1 0313199

(51) Int. Cl.
*H01L 51/56* (2006.01)
*H01L 51/52* (2006.01)
*H01L 27/32* (2006.01)

(52) U.S. Cl.
CPC ........ *H01L 51/5246* (2013.01); *H01L 27/322* (2013.01); *H01L 27/3244* (2013.01);
(Continued)

(58) Field of Classification Search
CPC . H01L 51/5246; H01L 51/56; H01L 51/5256; H01L 51/5281; H01L 51/5284;
(Continued)

(56) References Cited

U.S. PATENT DOCUMENTS

| 9,048,459 B2 | 6/2015 | Cho et al. |
| 2006/0125971 A1 | 6/2006 | Abileah et al. |

(Continued)

FOREIGN PATENT DOCUMENTS

| CN | 103682154 A | 3/2014 |
| CN | 103682155 A | 3/2014 |

(Continued)

OTHER PUBLICATIONS

International Search Report of PCT/CN2014/092482 in Chinese with English translation, mailed Apr. 9, 2015.
(Continued)

*Primary Examiner* — Kyoung Lee
(74) *Attorney, Agent, or Firm* — Collard & Roe, P.C.

(57) ABSTRACT

An active-matrix organic light-emitting diode (AMOLED) display panel, which includes an array substrate (1) and a color filter (CF) substrate (2) which are cell-assembled, is disclosed. The CF substrate (2) includes an anti-reflecting layer (21), a water blocking layer (24) and a CF layer (22) and a black matrix (BM) (23) arranged on the same layer. The anti-reflecting layer (21) is disposed on a side of the CF layer (22) and the BM (23) facing away from the array substrate (1). The water blocking layer (24) is disposed on a side of the CF layer (22) and the BM (23) close to the array substrate (1), or the water blocking layer (24) is disposed between the anti-reflecting layer (21) and the CF layer (22) and the BM (23). The AMOLED display panel can prevent water from entering the AMOLED display panel and is lighter and thinner.

20 Claims, 5 Drawing Sheets (52) U.S. Cl.
CPC ...... H01L 51/5256 (2013.01); H01L 51/5281 (2013.01); H01L 51/56 (2013.01); *H01L 27/3211* (2013.01); *H01L 27/3213* (2013.01); *H01L 51/5253* (2013.01); *H01L 51/5284* (2013.01); *H01L 2227/323* (2013.01); *H01L 2227/326* (2013.01); *H01L 2251/301* (2013.01); *H01L 2251/303* (2013.01); *H01L 2251/5315* (2013.01); *H01L 2251/558* (2013.01)

(58) Field of Classification Search
CPC ............... H01L 27/3244; H01L 27/322; H01L 51/5253; H01L 2227/323; H01L 27/3213; H01L 2251/558; H01L 2251/5315; H01L 27/3211; H01L 2251/301
See application file for complete search history.

(56) References Cited

U.S. PATENT DOCUMENTS

| | | | |
|---|---|---|---|
| 2011/0006327 | A1 | 1/2011 | Park et al. |
| 2011/0115961 | A1* | 5/2011 | Moriyama .......... H01L 27/3248 348/333.01 |
| 2012/0217516 | A1* | 8/2012 | Hatano ................. H01L 51/525 257/88 |
| 2012/0286312 | A1* | 11/2012 | Hatano ............... H01L 27/3246 257/98 |

FOREIGN PATENT DOCUMENTS

| | | |
|---|---|---|
| CN | 103682156 A | 3/2014 |
| CN | 103794734 A | 5/2014 |
| CN | 104112764 A | 10/2014 |
| JP | 2008-224930 A | 9/2008 |

OTHER PUBLICATIONS

Notice of Transmittal of the International Search Report of PCT/CN2014/092482 in Chinese, mailed Apr. 9, 2015.
Written Opinion of the International Searching Authority of PCT/CN2014/092482 in Chinese with English translation, mailed Apr. 9, 2015.
Chinese Office Action in Chinese Application No. 201410313199.3 mailed Jun. 20, 2016 with English translation.
Second Chinese Office Action in Chinese Application No. 201410313199.3 mailed Nov. 24, 2016 with English translation.
Third Chinese Office Action in Chinese Application No. 201410313199.3 mailed Apr. 1, 2017 with English translation.

* cited by examiner

ACTIVE-MATRIX ORGANIC LIGHT-EMITTING DIODE (AMOLED) DISPLAY PANEL, MANUFACTURING METHOD THEREOF AND DISPLAY DEVICE

CROSS REFERENCE TO RELATED APPLICATIONS

This application is the National Stage of PCT/CN2014/092482 filed on Nov. 28, 2014, which claims priority under 35 U.S.C. §119 of Chinese Application No. 201410313199.3 filed on Jul. 2, 2014, the disclosure of which is incorporated by reference.

TECHNICAL FIELD

Embodiments of the present invention relate to an active-matrix organic light-emitting diode (AMOLED) display panel, a manufacturing method thereof and a display device.

BACKGROUND

Compared with the traditional liquid crystal display (LCD) panel, the AMOLED display panel has the characteristics of a rapid response speed, higher contrast, and a wide viewing angle. These characteristics are highly favored by consumers.

Currently, in order to optimize the full-color display effect of the AMOLED, generally, a color filter (CF) substrate is arranged. That is to say, white light emitted by the AMOLED runs through the CF substrate, and hence the full-color display of the AMOLED can be achieved.

The current technology for achieving the full-color effect of the AMOLED by the arrangement of the CF substrate mainly includes two types of arrangements. One is fine metal mask (FMM) technology, where an RGB CF layer is formed by performing a vapor deposition on a display substrate by vapor deposition method. However, the FMM technology tends to result in a color blending problem and a low yield. The FMM technology also has difficulty in achieving high resolution. Therefore, the implementation of the full-color effect of the AMOLED by the FMM technology has difficulty in coping with high-generation production lines. The other arrangement is white organic light-emitting diode (WOLED) plus CF method (namely the full-color effect of the AMOLED is achieved by white light plus CFs). The method of achieving the full-color effect of a top-emission AMOLED through the WOLED+CF method has the advantages of high aperture opening ratio of the AMOLED, simple manufacturing process of backplanes and the like. The latter is currently widely applied.

The top-emission AMOLED refers to the light is emitted from the array substrate side to the CF substrate side. The implementation of the full-color effect of the top-emission AMOLED by the WOLED+CF method is usually as follows: a CF layer is disposed on the CF substrate, and hence the CF substrate and the array substrate are cell-assembled. In order to guarantee the cell-assembly accuracy of the CF substrate and the array substrate and improve the reliability of the AMOLED panel, the CF substrate mostly adopts glass as the substrate. Meanwhile, in order to reduce the reflection of external light and increase the contrast of the AMOLED panel, one layer of a circular polarizer must also be bonded to the CF substrate.

In order to shield the AMOLED panel, in general the thickness of the glass substrate in the CF substrate must be approximately 500 μm, which greatly increase the thickness of the AMOLED panel. Moreover, the circular polarizer must also be bonded to the CF substrate. Due to this structure, the AMOLED panel is cumbersome, and not conducive to the light and thin properties of the AMOLED panel.

SUMMARY

Embodiments of the present invention provide an AMOLED display panel, a manufacturing method thereof and a display device.

At least one embodiment of the present invention provides an AMOLED display panel, which comprises an array substrate and a CF substrate, which are cell-assembled. The CF substrate includes an anti-reflecting layer, a water blocking layer, a CF layer and a black matrix (BM), wherein the CF layer and the BM are arranged on a same layer. The anti-reflecting layer is disposed on a side of the CF layer and the BM facing away from the array substrate. The water blocking layer is disposed on a side of the CF layer and the BM close to the array substrate, or the water blocking layer is disposed between the anti-reflecting layer and the CF layer and the BM.

For instance, the thickness of the water blocking layer may range from 0.1 to 10 μm.

For instance, the water blocking layer may be a single layer or a plurality of mutually superimposed layers.

For instance, the single layer may be made from inorganic materials; the plurality of layers may include a layer made from inorganic materials and a layer made from organic layers. The inorganic materials may include any one selected from the group consisting of silicon nitride and silicon oxide, and the organic materials may include any one selected from the group consisting of poly epoxy resin and polyacrylic acid.

For instance, the anti-reflecting layer may include a ¼ wave plate, an adhesive and a linear polarizer superimposed to each other in sequence; and the linear polarizer is farther from the array substrate than the ¼ wave plate.

For instance, the ¼ wave plate may be made from cyclo-olefin polymer (COP) optical materials; and the adhesive may be made from polyacrylic acid materials.

For instance, the CF layer may be an RGB three-color CF layer or an RGBW four-color CF layer.

For instance, a bonding adhesive may be disposed between the array substrate and the CF substrate and can allow the array substrate and the CF substrate to be laminated corresponding to each other and bonded together.

For instance, the array substrate may include a lower substrate and a lower electrode, an electroluminescent layer, an upper electrode and a thin film encapsulation layer disposed on the lower substrate in sequence.

For instance, the thin film encapsulation layer may be a single layer or a plurality of mutually superimposed layers and may be made from same materials with the water blocking layer; and the bonding adhesive may be made from epoxy resin materials.

For instance, the bonding adhesive may be correspondingly disposed at peripheral edge areas of the array substrate and the CF substrate, or the bonding adhesive may be distributed on the entire surfaces where the array substrate and the CF substrate face to each other.

For instance, the lower substrate may be made from glass or plastic materials. The plastic material may be polyimide.

The embodiment of the present invention further provides a display device, which comprises any of the foregoing AMOLED display panels.

The embodiment of the present invention further provides a method for manufacturing any of the foregoing AMOLED display panels, which comprises: forming an array substrate; forming a CF substrate; and bonding the array substrate and the CF substrate, wherein the step of forming the CF substrate includes the step of forming a water blocking layer.

For instance, the step of forming the CF substrate and the step of bonding the array substrate and the CF substrate may include:

S1: forming a ¼ wave plate on carrier glass;

S2: forming a pattern of a CF layer and a pattern of BM in sequence on the carrier glass obtained in step S1 by a patterning process;

S3: forming a water blocking layer on the carrier glass obtained in step S2;

S4: coating or laminating a bonding adhesive on the carrier glass obtained in step S3, and laminating the array substrate and the carrier glass obtained in step S3 corresponding to each other;

S5: removing the carrier glass; and

S6: coating an adhesive on a linear polarizer, and laminating the linear polarizer to the ¼ wave plate.

For instance, the step of forming the CF substrate and the step of bonding the array substrate and the CF substrate may include:

S1: forming a ¼ wave plate on carrier glass;

S2: forming a water blocking layer on the carrier glass obtained in step S1;

S3: forming a pattern of a CF layer and a pattern of BM in sequence on the carrier glass obtained in step S2 by a patterning process;

S4: coating or laminating a bonding adhesive on the carrier glass obtained in step S3, and laminating the array substrate and the carrier glass obtained in step S3 corresponding to each other;

S5: removing the carrier glass; and

S6: coating an adhesive on a linear polarizer, and laminating the linear polarizer to the ¼ wave plate.

For instance, the water blocking layer may be formed by physical vapor deposition (PVD) or chemical vapor deposition (CVD).

BRIEF DESCRIPTION OF THE DRAWINGS

Simple descriptions will be given below for the accompanying drawings of the embodiments to provide a clearer understanding of the technical proposals of the embodiments of the present invention. The drawings described below only involve some embodiments of the present invention but are not intended to limit the present invention.

REFERENCE NUMERALS OF THE ACCOMPANYING DRAWINGS

1. Array Substrate; 11. Lower Substrate; 12. Lower Electrode; 13. Electroluminescent Layer; 14. Upper Electrode; 15. Thin Film Encapsulation Layer; 2. CF Substrate; 21. Anti-reflecting Layer; 211. ¼ Wave Plate; 212. Adhesive; 213. Linear Polarizer; 22. CF Layer; 23. BM; 24. Water Blocking Layer; 3. Bonding Adhesive; 4. Carrier Glass.

DETAILED DESCRIPTION

For clearer understanding of the objectives, technical proposals and advantages of the embodiments of the present invention, a clear and complete description will be given below to the technical proposals of the embodiments of the present invention with reference to the accompanying drawings of the embodiments of the present invention. Obviously, the preferred embodiments are only part of the embodiments of the present invention and do not include all the embodiments. All the other embodiments obtained by those skilled in the art without creative efforts on the basis of the embodiments of the present invention illustrated shall fall within the scope of protection of the present invention.

Embodiment 1

Figure 1:
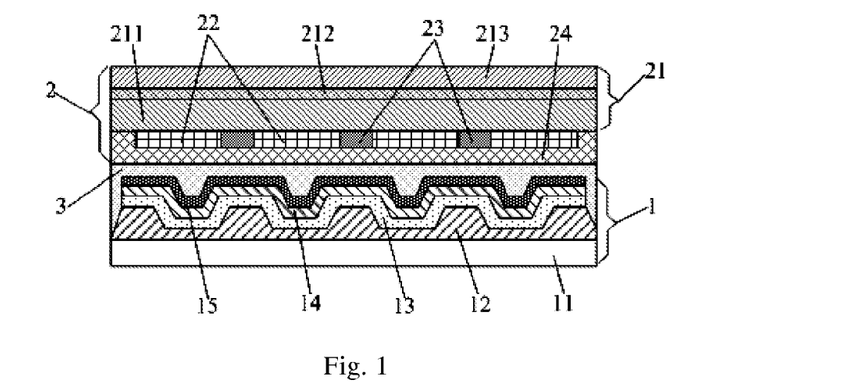
FIG. 1 is a structural sectional view of an AMOLED display panel provided by the embodiment 1 of the present invention.

The embodiment provides an AMOLED display panel, which, as illustrated in FIG. 1, comprises an array substrate 1 and a CF substrate 2, which are cell-assembled. The CF substrate 2 includes an anti-reflecting layer 21, a CF layer 22 and a BM 23, wherein a the CF layer 22 and the BM 23 are arranged on the same layer. The anti-reflecting layer 21 is disposed on one side of the CF layer 22 and the BM 23 away from the array substrate 1. The CF substrate 2 further includes a water blocking layer 24 which is disposed on a side of the CF layer 22 and the BM 23 close to the array substrate 1.

For instance, the thickness of the water blocking layer 24 may be ranged from 0.1 to 10 μm. The water blocking layer 24 may be a single layer which may be made from inorganic materials, wherein, for instance, the inorganic materials may include any one selected from the group consisting of silicon nitride and silicon oxide. The inorganic material not only has good light transmittance but also has good water blocking performance. The water blocking layer 24 not only protects the AMOLED display panel but also does not hinder the normal display of the AMOLED display panel.

It should be noted that the water blocking layer 24 may also be a plurality of mutually superimposed layers which may include a layer made from inorganic materials and a layer made from organic materials. The organic materials may include any one selected from the group consisting of poly epoxy resin and polyacrylic acid. As the organic materials have better flexibility than the inorganic materials, the flexibility of the entire water blocking layer 24 can be improved by the mutual superimposition of the layers made from the organic materials and the layers made from the inorganic materials.

The arrangement of the water blocking layer 24 can prevent water from entering the AMOLED display panel, so that the AMOLED display panel can be well protected. At the same time, due to the arrangement of the water blocking layer 24, no glass substrate is required to be arranged in the CF substrate of the AMOLED display panel. The thickness of the water blocking layer 24 may be much smaller than that of the glass substrate, so that the overall thickness of the AMOLED display panel can be greatly reduced. Therefore, the AMOLED display panel can be lighter and thinner.

In the embodiment, the anti-reflecting layer 21 may include a ¼ wave plate 211, an adhesive 212 and a linear polarizer 213 superimposed to each other in sequence; and the linear polarizer 213 is farther from the array substrate 1 than the ¼ wave plate 211.

The AMOLED display panel provided by the embodiment adopts top-emission type. The anti-reflecting layer 21 is disposed on a light-emitting side of the AMOLED display panel, namely light is emitted from the side of the CF substrate 2. When ambient light irradiates the AMOLED display panel, the light runs through the linear polarizer 213 at first. The light running through the linear polarizer 213 becomes linearly polarized light in the same polarization direction. Subsequently, a ¼ optical path difference is produced after the linearly polarized light runs through the ¼ wave plate 211. Subsequently, the linearly polarized light having the ¼ optical path difference is reflected and runs through the ¼ wave plate 211 again, and hence a ¼ optical path difference is produced again. Thus, a ½ optical path difference is produced in total in the linearly polarized light running through the linear polarizer 213. Because the polarization direction of the linearly polarized light having the ½ optical path difference is also changed, the light cannot run through the linear polarizer 213 again. Therefore, the anti-reflecting layer 21 has the function of reducing the reflection of the ambient light, and hence the contrast of the AMOLED display panel can be increased.

For instance, the ¼ wave plate 211 may be made from a COP optical material. This material has low optical path difference deviation, so that the optical performance of the ¼ wave plate 211 can be improved. The adhesive 212 may be made from a polyacrylic acid material. This material not only allows the ¼ wave plate 211 and the linear polarizer 213 to be bonded together but also do not affect the light transmittance between the ¼ wave plate 211 and the linear polarizer 213.

For instance, in the embodiment, the CF layer 22 may be an RGB three-color CF layer or an RGBW four-color CF layer. The present invention is not limited thereto.

For instance, in the embodiment, a bonding adhesive 3 may be disposed between the array substrate 1 and the CF substrate 2 and can allow the array substrate 1 and the CF substrate 2 to be coated corresponding to each other and bonded together.

For instance, the array substrate 1 may include a lower substrate 11 and a lower electrode 12, an electroluminescent layer 13, an upper electrode 14 and a thin film encapsulation layer 15 arranged on the lower substrate 11 in sequence. The array substrate includes pixel arrays. Each subpixel includes a drive circuit and an organic light-emitting diode (OLED) (including the lower electrode 12, the electroluminescent layer 13 and the upper electrode 14). The drive circuit includes devices such as a thin-film transistor (TFT) and a capacitor.

For instance, the thin film encapsulation layer 15 may be a single layer or a plurality of mutually superimposed layers and may be made from a material same as the water blocking layer 24; and the bonding adhesive 3 may be made from epoxy resin materials. The bonding adhesive 3 tends to damage the OLED device (namely the electroluminescent layer 13). Due to the arrangement of the thin film encapsulation layer 15, the bonding adhesive 3 and the OLED device (namely the electroluminescent layer 13) on the array substrate 1 can be isolated from each other. Therefore, the damage of the bonding adhesive 3 to the OLED device (namely the electroluminescent layer 13) can be effectively avoided.

For instance, in the embodiment, the bonding adhesive 3 may be distributed on the entire surfaces where the array substrate 1 and the CF substrate 2 face to each other (e.g., the bonding adhesive 3 is double-faced adhesive tape). It should be noted that the bonding adhesive 3 may also be correspondingly disposed at peripheral edge areas of the array substrate 1 and the CF substrate 2. No matter the bonding adhesive 3 is correspondingly disposed at the peripheral edge area of the AMOLED display panel or is correspondingly disposed on the entire surface of the AMOLED display panel, the bonding adhesive 3 can firmly bond the array substrate 1 and the CF substrate 2 together.

For instance, in the embodiment, the lower substrate 11 may be made from plastic materials. For instance, the plastic material may be polyimide. The material has some flexibility, so that the entire AMOLED display panel is flexible, and hence the arrangement of the AMOLED display panel can be more flexible. Of course, the lower substrate 11 may also be made from glass materials.

Based on the structure of the AMOLED display panel, the embodiment further provides a method for manufacturing the AMOLED display panel, which comprises: forming an array substrate; forming a CF substrate; and bonding the array substrate and the CF substrate, wherein the step of forming the CF substrate includes the step of forming a water blocking layer.

Figure 2A:
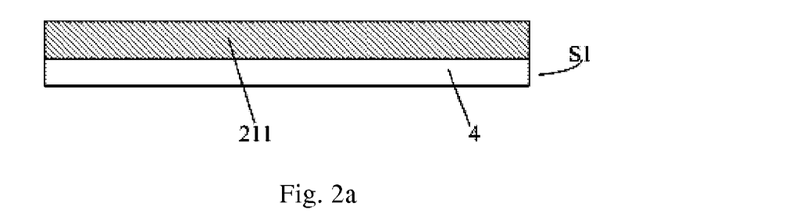
FIG. 2a is a schematic diagram illustrating the step of forming a ¼ wave plate on a carrier glass in the step S1 of the embodiment 1.

The step of forming the array substrate may adopt the conventional method in the prior art, so further description need not to be given here. The step of forming the CF substrate and the step of bonding the array substrate and the CF substrate may include the following steps as shown in FIGS. 2a to 2f:

S1: forming a ¼ wave plate 211 on carrier glass 4.

In the step, forming the ¼ wave plate 211 may be performed as follows: a layer of COP optical material is coated on the carrier glass 4 at first, and then the materials are baked; or the formed ¼ wave plate 211 may also be bonded to the carrier glass 4 by an adhesive glue.

Figure 2B:
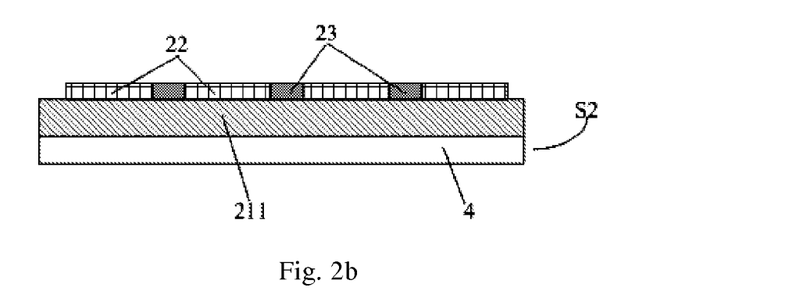
FIG. 2b is a schematic diagram illustrating the step of forming a CF layer and a BM on the carrier glass in the step S2 of the embodiment 1.

S2: forming a pattern of a CF layer 22 and a pattern of BM 23 in sequence on the carrier glass 4 obtained in step S1 by a patterning process.

In the step, the BM 23 may be formed at first, and then the CF layer is formed. The patterning process includes: coating one layer of, e.g., CF layer film or BM film on the carrier glass 4 obtained in step S1 at first, and then the CF film or the BM film is subjected to exposure, development and etching to finally form the patterns of the CF layer 22 or the BM 23.

Figure 2C:
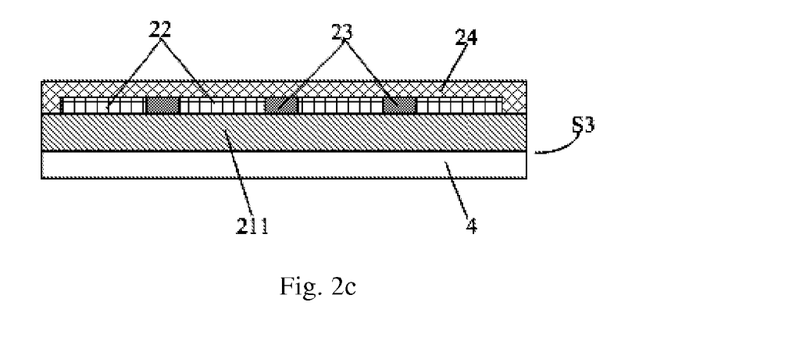
FIG. 2c is a schematic diagram illustrating the step of forming a water blocking layer on the carrier glass in the step S3 of the embodiment 1.

S3: forming a water blocking layer 24 on the carrier glass 4 obtained in step S2.

In the step, the water blocking layer 24 may be formed by PVD (namely vacuum evaporation PVD) or CVD.

Figure 2D:
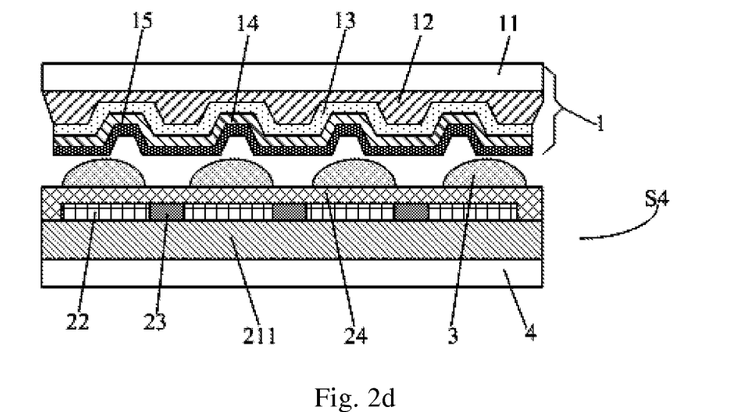
FIG. 2d is a schematic diagram illustrating the step of laminating the array substrate and the carrier glass corresponding to each other in the step S4 of the embodiment 1.

S4: coating or laminating a bonding adhesive 3 on the carrier glass 4 obtained in step S3, and laminating the array substrate 1 and the carrier glass 4 obtained in step S3 corresponding to each other.

Figure 2E:
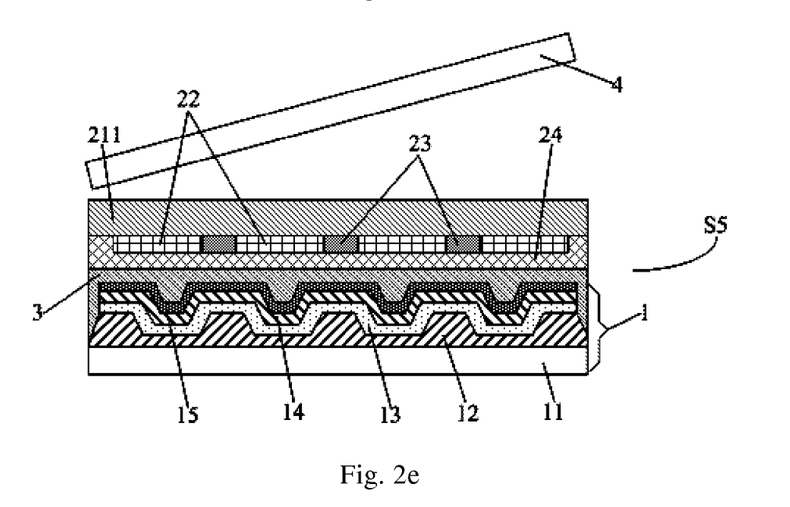
FIG. 2e is a schematic diagram illustrating the step of removing the carrier glass in the step S5 of the embodiment 1.

S5: removing the carrier glass 4.

In the step, the carrier glass 4 and the ¼ wave plate 211 are separated from each other by laser irradiation at first, and then the carrier glass 4 is removed.

Figure 2F:
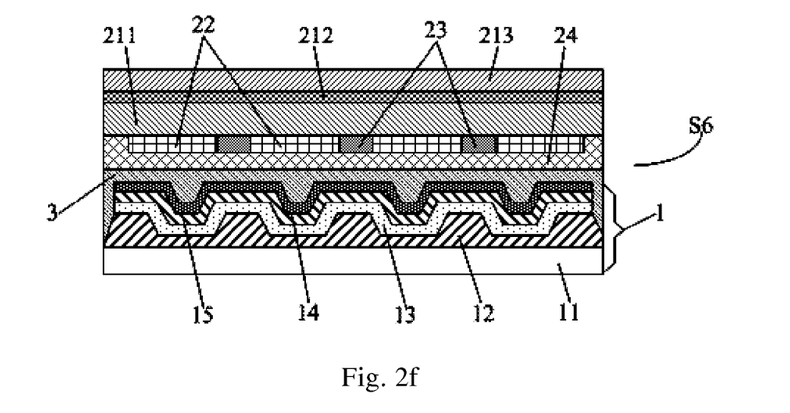
FIG. 2f is a schematic diagram of the step of laminating a linear polarizer in the step S6 of the embodiment 1.

S6: coating an adhesive 212 on a linear polarizer 213, and laminating the linear polarizer 213 to the ¼ wave plate 211.

Thus, the AMOLED display panel is manufactured.

Embodiment 2

Figure 3:
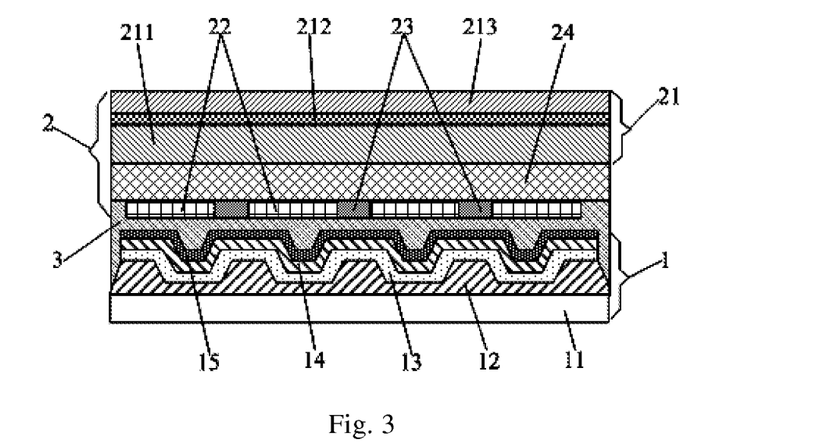
FIG. 3 is a structural sectional view of an AMOLED display panel provided by the embodiment 2 of the present invention.

The embodiment provides an AMOLED display panel. As different from the embodiment 1, as illustrated in FIG. 3, the water blocking layer 24 is disposed between the anti-reflecting layer 21 and the CF layer 22 and the BM 23.

Other structures of the AMOLED display panel in the embodiment are the same with those in the embodiment 1. It needs not to be described here again.

Based on the structure of the AMOLED display panel, the embodiment further provides a method for manufacturing the AMOLED display panel. As different from the method for manufacturing the AMOLED display panel in embodiment 1, the step of forming the CF substrate and the step of bonding the array substrate and the CF substrate may include the following steps as shown in FIGS. 4a to 4f.

Figure 4A:
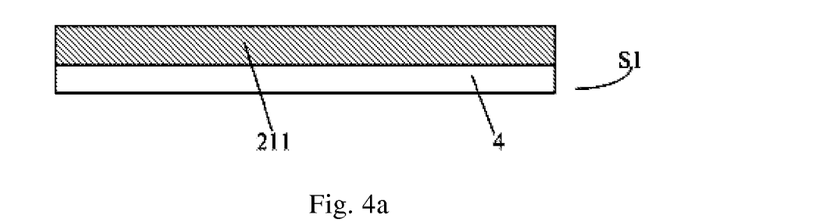
FIG. 4a is a schematic diagram illustrating the step of forming a ¼ wave plate on carrier glass in the step S1 of the embodiment 2.

S1: forming a ¼ wave plate 211 on carrier glass 4.

Figure 4B:
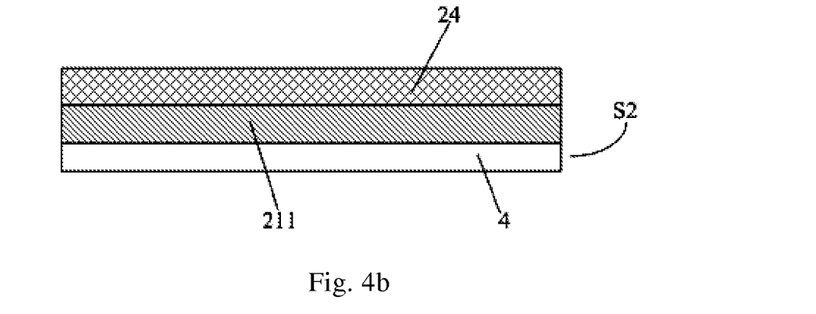
FIG. 4b is a schematic diagram illustrating the step of forming a water blocking layer on the carrier glass in the step S2 of the embodiment 2.

S2: forming a water blocking layer 24 on the carrier glass 4 obtained in step S1.

Figure 4C:
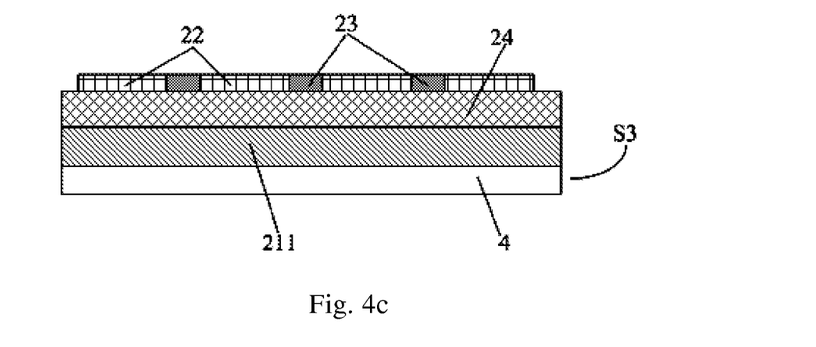
FIG. 4c is a schematic diagram illustrating the step of forming a CF layer and a BM on the carrier glass in the step S3 of the embodiment 2.

S3: forming a pattern of a CF layer 22 and a pattern of BM 23 in sequence on the carrier glass 4 obtained in step S2 by patterning process.

Figure 4D:
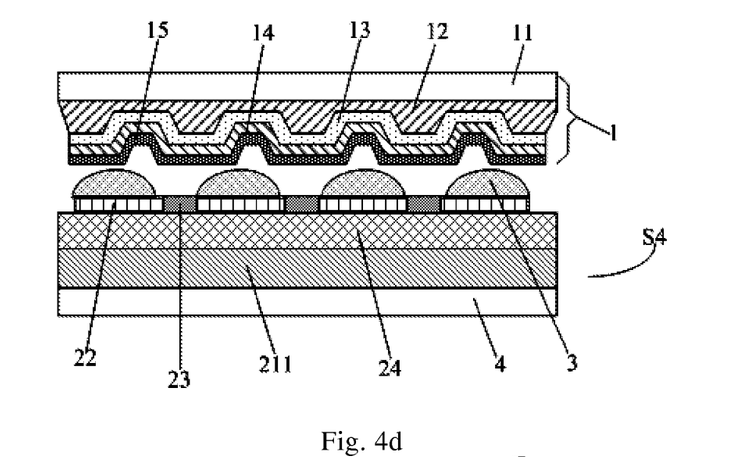
FIG. 4d is a schematic diagram illustrating the step of laminating the array substrate and the carrier glass corresponding to each other in the step S4 of the embodiment 2.

S4: coating or laminating a bonding adhesive 3 on the carrier glass 4 obtained in step S3, and laminating the array substrate 1 and the carrier glass 4 obtained in step S3 corresponding to each other.

Figure 4E:
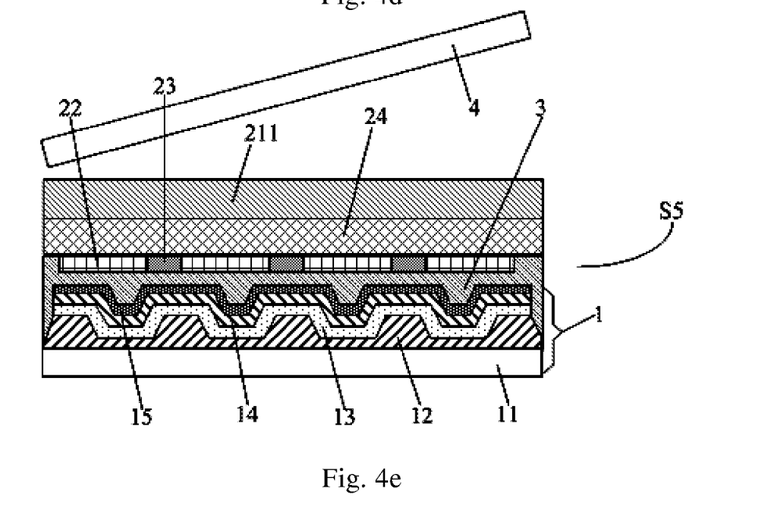
FIG. 4e is a schematic diagram illustrating the step of removing the carrier glass in the step S5 of the embodiment 2.

S5: removing the carrier glass 4.

Figure 4F:
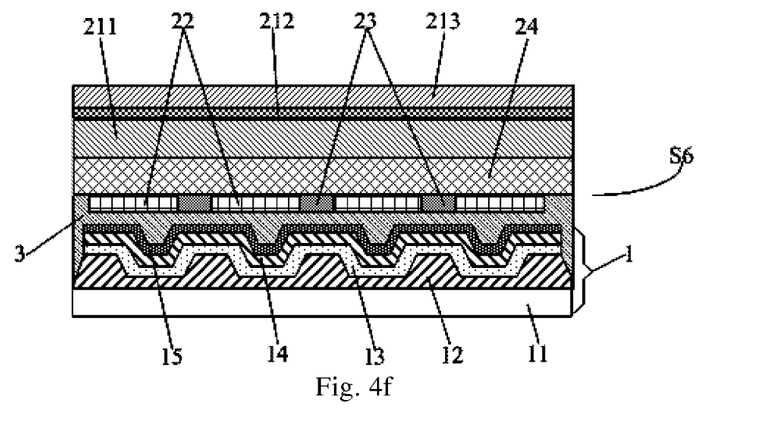
FIG. 4f is a schematic diagram illustrating the step of laminating a linear polarizer in the step S6 of the embodiment 2.

S6: coating an adhesive 212 on a linear polarizer 213, and laminating the linear polarizer 213 to the ¼ wave plate 211.

The specific manufacturing processes in the steps S1 to S6 are the same with those in the embodiment 1. It needs not to be described here again.

In the AMOLED display panels provided by the embodiments 1 and 2, as the water blocking layer is disposed in the CF substrate, water can be prevented from entering the AMOLED display panel, and hence the AMOLED display panel can be well protected. Due to the arrangement of the water blocking layer, no glass substrate is required to be disposed in the CF substrate. As the thickness of the water blocking layer is much smaller than that of the glass substrate, the overall thickness of the AMOLED display panel can be greatly reduced due to the arrangement of the water blocking layer, and hence the AMOLED display panel can be lighter and thinner.

Embodiment 3

The embodiment provides a display device, which comprises the AMOLED display panel provided by the embodiment 1 or 2.

Due to the AMOLED display panel provided by the embodiment 1 or 2, the display device not only can avoid water intrusion but also can be lighter and thinner.

The foregoing is only the preferred embodiments of the present invention and not intended to limit the scope of protection of the present invention. The scope of protection of the present invention should be defined by the appended claims.

The application claims priority to the Chinese patent application No. 201410313199.3, filed Jul. 2, 2014, the disclosure of which is incorporated herein by reference as part of the application.

What is claimed is:

1. An active-matrix organic light-emitting diode (AMO-LED) display panel, comprising an array substrate and a color filter (CF) substrate bonded with each other, wherein
the CF substrate includes an anti-reflecting layer, a water blocking layer, a CF layer and a black matrix (BM), wherein the CF layer and the BM are arranged on a same layer; the anti-reflecting layer is disposed on a side of the CF layer and the BM facing away from the array substrate;
the water blocking layer is disposed on a side of the CF layer and the BM close to the array substrate, or the water blocking layer is disposed between the anti-reflecting layer and the CF layer and the BM;
the anti-reflecting layer includes a ¼ wave plate, an adhesive and a linear polarizer superimposed to each other in sequence; and
the linear polarizer is farther from the array substrate than the ¼ wave plate.

2. The AMOLED display panel according to claim 1, wherein the water blocking layer has a thickness of from 0.1 to 10 μm.

3. The AMOLED display panel according to claim 1, wherein the water blocking layer is a single layer or a plurality of mutually superimposed layers.

4. The AMOLED display panel according to claim 3, wherein the single layer is made from inorganic materials; the plurality of layers include a layer made from inorganic materials and a layer made from organic materials;
the inorganic materials comprise any one selected from a group consisting of silicon nitride and silicon oxide; and the organic materials comprise any one selected from a group consisting of poly epoxy resin and polyacrylic acid.

5. The AMOLED display panel according to claim 1, wherein the ¼ wave plate is made from cyclo-olefin polymer (COP) optical materials; and the adhesive is made from polyacrylic acid materials.

6. The AMOLED display panel according to claim 1, wherein the CF layer is an RGB three-color CF layer or an RGBW four-color CF layer.

7. The AMOLED display panel according to claim 1, wherein a bonding adhesive is disposed between the array substrate and the CF substrate and allows the array substrate and the CF substrate to be laminated corresponding to each other and bonded together.

8. The AMOLED display panel according to claim 7, wherein the array substrate includes a lower substrate, and a lower electrode, an electroluminescent layer, an upper electrode and a thin film encapsulation layer disposed on the lower substrate in sequence.

9. The AMOLED display panel according to claim 8, wherein the thin film encapsulation layer is a single layer or a plurality of mutually superimposed layers and made from same materials with the water blocking layer; and the bonding adhesive is made from epoxy resin materials.

10. The AMOLED display panel according to claim 7, wherein the bonding adhesive is disposed at areas corresponding to peripheral edge areas of the array substrate and the CF substrate, or the bonding adhesive is distributed on the entire surface where the array substrate and the CF substrate face to each other.

11. The AMOLED display panel according to claim 8, wherein the lower substrate is made from glass or plastic materials; and the plastic material is polyimide.

12. A display device, comprising the AMOLED display panel according to claim 1.

13. A method for manufacturing the AMOLED display panel according to claim 1, comprising: forming an array substrate; forming a CF substrate; and bonding the array substrate and the CF substrate, wherein the step of forming the CF substrate includes a step of forming a water blocking layer.

14. The manufacturing method according to claim 13, wherein the step of forming the CF substrate and the step of bonding the array substrate and the CF substrate include:
S1: forming a ¼ wave plate on a carrier glass;
S2: forming a pattern of a CF layer and a pattern of a black matrix (BM) in sequence on the carrier glass obtained in step S1 by a patterning process;
S3: forming a water blocking layer on the carrier glass obtained in step S2;
S4: coating or laminating a bonding adhesive on the carrier glass obtained in step S3, and laminating the array substrate and the carrier glass obtained in step S3 corresponding to each other;
S5: removing the carrier glass; and
S6: coating an adhesive on a linear polarizer, and laminating the linear polarizer to the ¼ wave plate.

15. The manufacturing method according to claim 13, wherein the step of forming the CF substrate and the step of bonding the array substrate and the CF substrate include:
S1: forming a ¼ wave plate on a carrier glass;
S2: forming a water blocking layer on the carrier glass obtained in step S1;
S3: forming a pattern of a CF layer and a pattern of a BM in sequence on the carrier glass obtained in step S2 by a patterning process;
S4: coating or laminating a bonding adhesive on the carrier glass obtained in step S3, and laminating the array substrate and the carrier glass obtained in step S3 corresponding to each other;
S5: removing the carrier glass; and
S6: coating an adhesive on a linear polarizer, and laminating the linear polarizer to the ¼ wave plate.

16. The manufacturing method according to claim 13, wherein the water blocking layer is formed by physical vapor deposition (PVD) or chemical vapor deposition (CVD).

17. The AMOLED display panel according to claim 2, wherein the water blocking layer is a single layer or a plurality of mutually superimposed layers.

18. The AMOLED display panel according to claim 8, wherein the bonding adhesive is disposed at areas corresponding to peripheral edge areas of the array substrate and the CF substrate, or the bonding adhesive is distributed on the entire surface where the array substrate and the CF substrate face to each other.

19. An active-matrix organic light-emitting diode (AMOLED) display panel, comprising an array substrate and a color filter (CF) substrate bonded with each other, wherein
the CF substrate includes an anti-reflecting layer, a water blocking layer, a CF layer and a black matrix (BM), wherein the CF layer and the BM are arranged on a same layer; the anti-reflecting layer is disposed on a side of the CF layer and the BM facing away from the array substrate; and
the water blocking layer is disposed on a side of the CF layer and the BM close to the array substrate, or the water blocking layer is disposed between the anti-reflecting layer and the CF layer and the BM;
a bonding adhesive is disposed between the array substrate and the CF substrate and allows the array substrate and the CF substrate to be laminated corresponding to each other and bonded together;
the array substrate includes a lower substrate, and a lower electrode, an electroluminescent layer, an upper electrode and a thin film encapsulation layer disposed on the lower substrate in sequence.

20. The AMOLED display panel according to claim 19, further comprising a bonding adhesive disposed between the array substrate and the CF substrate, wherein the thin film encapsulation layer is a single layer or a plurality of mutually superimposed layers and made from same materials with the water blocking layer; and the bonding adhesive is made from epoxy resin materials.

* * * * *